United States Patent [19]

Okano

[11] 4,398,462
[45] Aug. 16, 1983

[54] HOT MELT SCREEN PRINTING MACHINE

[75] Inventor: Tadao Okano, Toride, Japan

[73] Assignee: TDK Electronics Co., Ltd., Tokyo, Japan

[21] Appl. No.: 154,134

[22] Filed: May 29, 1980

[30] Foreign Application Priority Data

| May 30, 1979 [JP] | Japan | 54-67183 |
| Aug. 17, 1979 [JP] | Japan | 54-104605 |
| Dec. 13, 1979 [JP] | Japan | 54-162088 |

[51] Int. Cl.³ .................... B41L 13/02; H05B 3/16
[52] U.S. Cl. ................... 101/128.21; 101/127; 219/543; 338/211
[58] Field of Search .............. 219/211, 212, 528, 543, 219/544, 549; 338/211, 212; 427/49, 98; 101/126, 127, 127.1, 128.21

[56] References Cited

U.S. PATENT DOCUMENTS

| 1,741,054 | 12/1929 | Graham | 219/549 |
| 2,274,840 | 3/1942 | Marick | 338/212 |
| 2,703,356 | 3/1955 | Buchanan | 338/211 |
| 2,731,912 | 1/1956 | Welsh | 101/126 |
| 3,166,688 | 1/1965 | Rowand | 219/549 |
| 3,577,276 | 5/1971 | Edge | 427/101 |
| 3,666,527 | 5/1972 | Feldstein | 427/98 |
| 3,800,697 | 4/1974 | Sullivan | 101/127.1 |
| 3,876,968 | 4/1975 | Barnes | 219/543 |
| 4,003,877 | 1/1977 | Lipson | 427/98 |
| 4,264,646 | 4/1981 | Thornburg | 427/98 |

FOREIGN PATENT DOCUMENTS 152587  5/1932  Switzerland ................ 101/126

OTHER PUBLICATIONS

Screen for Printing of Electronic Circuits; Dubey Microelectronics & Reliability; vol. 13, pp. 203-207.
Screen: Essential Tool for Thick Film Printing Franconville; Solid State Technology; Oct. 1974, pp. 61-68.
The Squeegee in Printing of Electronic Circuits; Dubey Solid State Physics Labratory; Delhi India; pp. 427-429.

Primary Examiner—Clyde I. Coughenour
Attorney, Agent, or Firm—Armstrong, Nikaido, Marmelstein & Kubovcik

[57] ABSTRACT

The present invention consists of insulating material fibers and an electroless plating layer formed on the fibers. The plating layer preferably consists of a nickel phosphorous alloy. A squeezing means for forcing the printing ink to pass through a printing pattern and/or a printing base for mounting an article to be printed are provided with a heating means.

13 Claims, 29 Drawing Figures

HOT MELT SCREEN PRINTING MACHINE

The present invention relates to a hot melt screen printing technique, and more particularly, a hot melt screen printing meachine with a screen printing plate and a process for producing the screen printing plate.

The recently developed hot melt screen printing technique is advantageous over the conventional screen printing technique in the following points.

A. Since in the hot melt screen printing technique, a printing ink or paste, which is forced to pass through a printing pattern of the screen plate is heated and melted by a heating means, the printing ink can be fixed simultaneously with the printing. Accordingly, when electronic parts made of ceramics are produced by the hot melt screen printing, a dielectric paste and a current conductive paste are printed on a substrate, and these pastes are fixed simultaneously with the printing. A separate fixing step is, therefore, eliminated, and hence, the production process of the electronic parts becomes simple and the heat energy required for a separate fixing step can be saved.

B. The printing ink used in the hot melt screen printing is solid at room temperature but is rendered viscous by the application of heat thereto having a temperature of from 70° to 75° C. The viscous printing ink, which is in a state similar to paste, can be made solid again by decreasing its temperature to room temperature. The printing ink having such a temperature characteristic may comprise a paraffin as the major component. Accordingly, in order to melt the printing ink it is only necessary to apply heat to the printing ink, and a solvent, which is used in the conventional screen printing, is not necessary. In this regard, in the conventional screen printing technique, a disadvantageously large amount of solvent is used and the production process of electronic parts becomes complicated due to blending of the solvent into the printing ink.

C. The passing of the printing ink through the screen plate is excellent.

The hot melt screen printing technique has advantages such as explained in items A, B and C, above. However, the printing accuracy of the hot melt screen printing technique is inferior to that of the conventional screen printing technique.

The known hot melt screen printing of technique will now be explained with reference to FIGS. 1A, 1B, 2A and 2B, wherein.

Figure 1A:
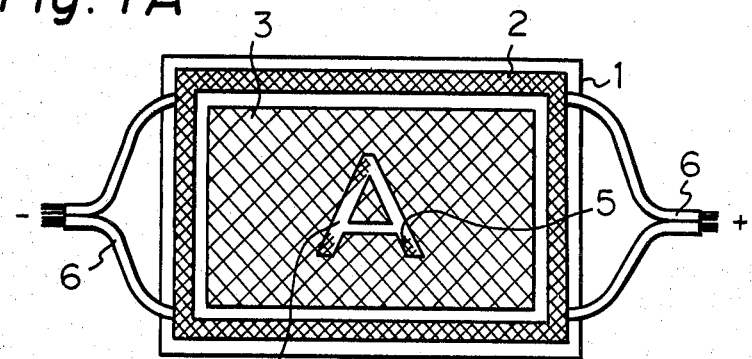
FIGS. 1A and 1B are plan views of screen plates.
Figure 1B:
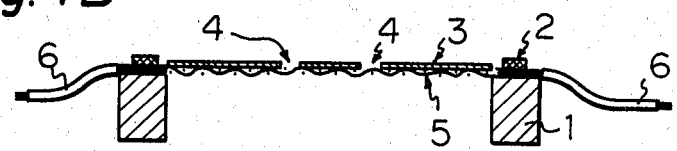

In the screen plate illustrated in FIGS. 1A and 1B, a stainless steel mesh 5 of is spread within a wooden frame 1 and fixed between the wooden frame 1 and metal fittings 2. The entire region of the stainless steel mesh 5, except for a printing pattern 4, is sealed by an emulsion resin stencil 3. Electrode leads 6 are connected to the stainless steel mesh 5 at opposite sides of the mesh. When a voltage is applied to the electrode leads 6, the stainless steel mesh 5 is heated due to the electric resistance thereof and the printing ink is heated, melted and, then, forced to pass through the printing pattern 4. The screen plate illustrated in FIGS. 1A and 1B is advantageous in the fact that the printing pattern 4 can be easily formed by depositing the emulsion resin stencil 3 on the stainless steel mesh 5. In the plate setting, the emulsion resin is subjected to a cycle of a water treatment and a heat treatment.

The screen plate illustrated in FIGS. 1A and B is disadvantageous in the following points. The screen plate is not suitable for the application of the cycle of water and heat treatments, and the accuracy of the plate setting is low. The tension of the stainless steel mesh 5 is greatly varied during and after the type setting, and therefore, it is difficult to obtain a constant printing pressure. Since the electric resistance of the stainless steel of the printing mesh is low, a high current is conducted through the printing mesh during the printing. Accordingly, the installation cost of the screen printing machine is high, the safety of operators of the screen printing machine is low, and the stainless steel mesh is liable to deform during the heating operation due to the thermal expansion thereof. Because of the deformation, the printing pattern 4 and the wooden frame 1 distort.

Figure 2A:
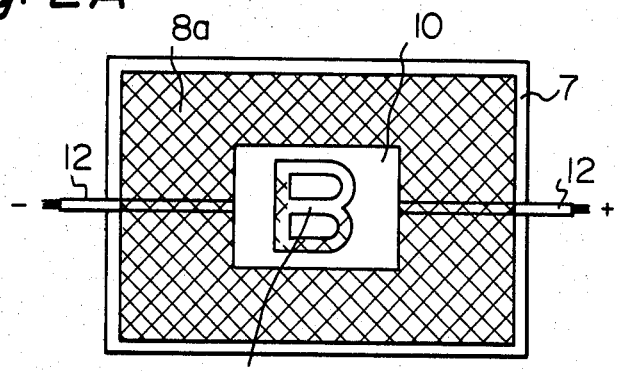
FIGS. 2A and 2B are cross sectional views of FIGS. 1A and 1B, respectively.
Figure 2B:
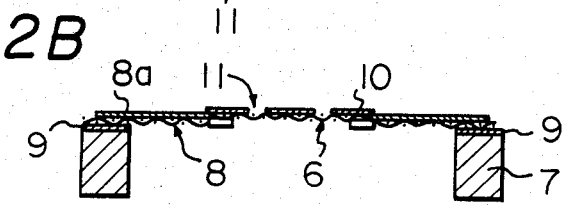

Illustrated in FIGS. 2A and B is a known screen plate, in which a mesh 8 made of Tetoron (trade mark of a polyester synthetic fiber) is spread within a frame 7 made of a metallic material, such as aluminum, which is difficult to deform. The Tetoron mesh 8 is fixed to the frame 7 by a bonding layer 9. A heating plate 10 is provided on the middle part of the Tetoron mesh 8 by an electroforming or an electrolytic plating of nickel. A printing pattern 11 formed in the heating plate 10 exposes a part of the Tetoron mesh 8. The portion of Tetoron mesh 8 positioned outside of the heating plate 10 is covered and sealed by an emulsion resin stencil 8a. Electrode leads 12 are connected to the heating plate 10 at each side of the plate and to a current source, so that heat is generated in the heating plate.

The screen plate illustrated in FIGS. 2A and B is advantageous over that illustrated in FIGS. 1A and B in the point that the plate setting accuracy and dimensional accuracy of the printing pattern are high. However, since the heating plate 10 provided with a printing pattern is used, the structure of the screen print is complicated and, hence, the production cost of the screen print is expensive. In addition, since the heating plate 10 has a combined purpose of heating and sealing the Tetoron mesh 8 beneath the plate 10, the material of heating plate 10 and the bonding strength of the heating plate with the Tetoron mesh 8 must be sufficiently high and stable enough for ensuring the printing on any article to be printed by squeezing on the heating plate. However, the kinds of article to be printed using the screen plate illustrated in FIGS. 2A and B are limited. Furthermore, since the electric resistance of the heating plate 10 is low, a high current of, for example more than 100 A, is conducted through the heating plate 10. Accordingly, the installation cost of the printing machine is disadvantageously high and the safety of operators of the machine is disadvantageously low. In order to elimiate these disadvantages, the dimensions of the printing surface area must be kept as small as possible, which is also a disadvantage.

It is an object of the present invention to provide a hot melt screen printing machine with a screen plate which can achieve a highly accurate hot melt screen printing required for the manufacture of highly precise electronic parts.

It is another object of the present invention to provide a hot melt screen printing machine with a screen plate of a hot melt screen printing, wherein a satisfactorily high heating temperature is ensured by a low electrical current.

It is a further object of the present invention to provide a process for producing the screen plate mentioned above.

In accordance with the objects of the present invention there is provided a hot melt screen printing machine having a screen plate which comprises, a screen mesh at least a part of which screen mesh is resistance-heated due to the electrical current and the resistance of the screen mesh, a printing pattern formed on the screen mesh, and a means for applying an electric current to the screen mesh, characterized in that the screen mesh consists of insulating material fibers and an electroless plating layer formed on each of the fibers.

The hot melt screen printing machine according to the present invention is further characterized in that at least one of a printing base for mounting an article to be printed and a squeezing means for passing a printing ink from the screen plate toward the article to be printed is provided with a heating means.

A process for producing the screen plate according to the present invention is characterized in that an electroless plating layer is applied on a mesh consisting of an insulating material and, then, a printing pattern is formed on the mesh by photo engraving.

Figure 3:
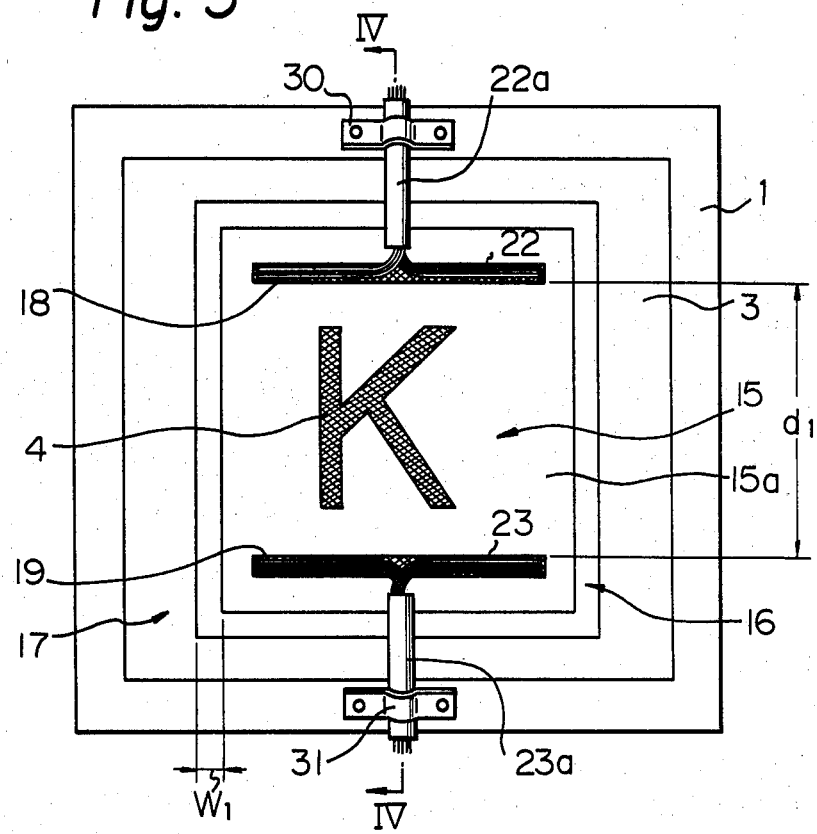
Figure 4:
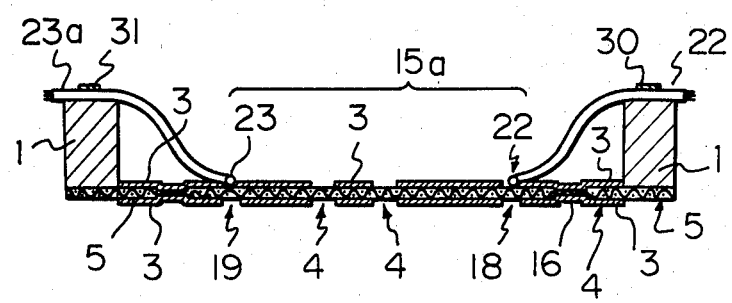
Figure 5:
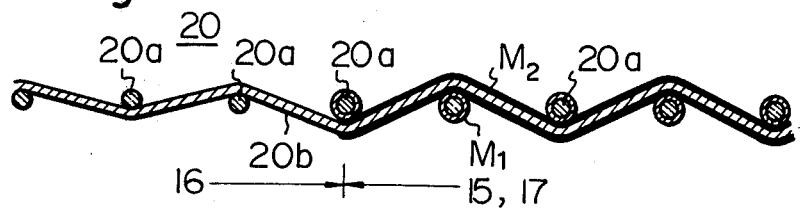
Figure 7:
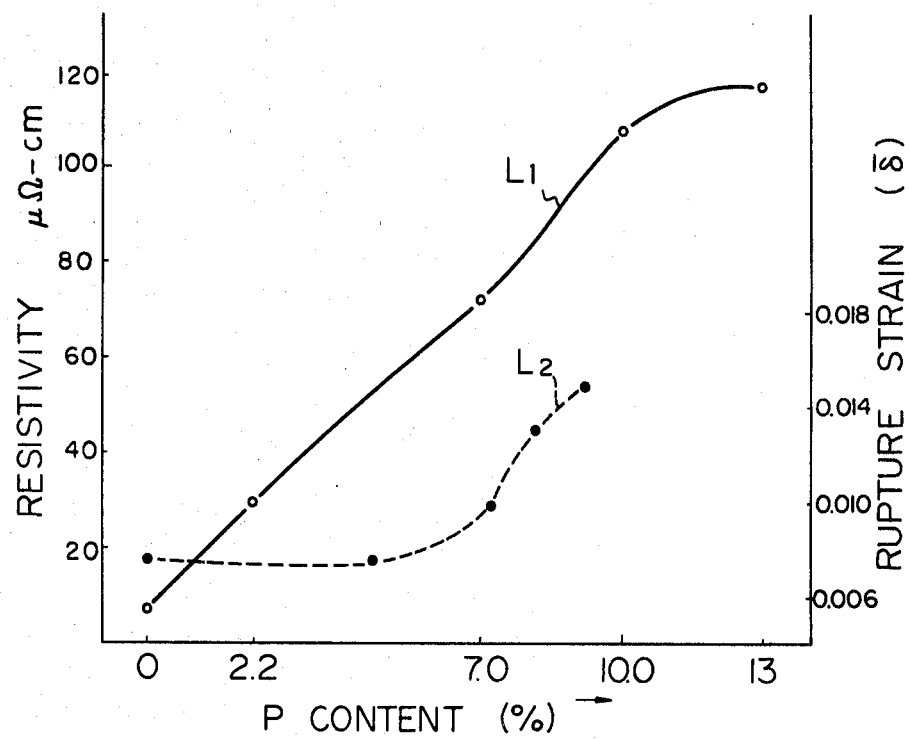
Figure 8:
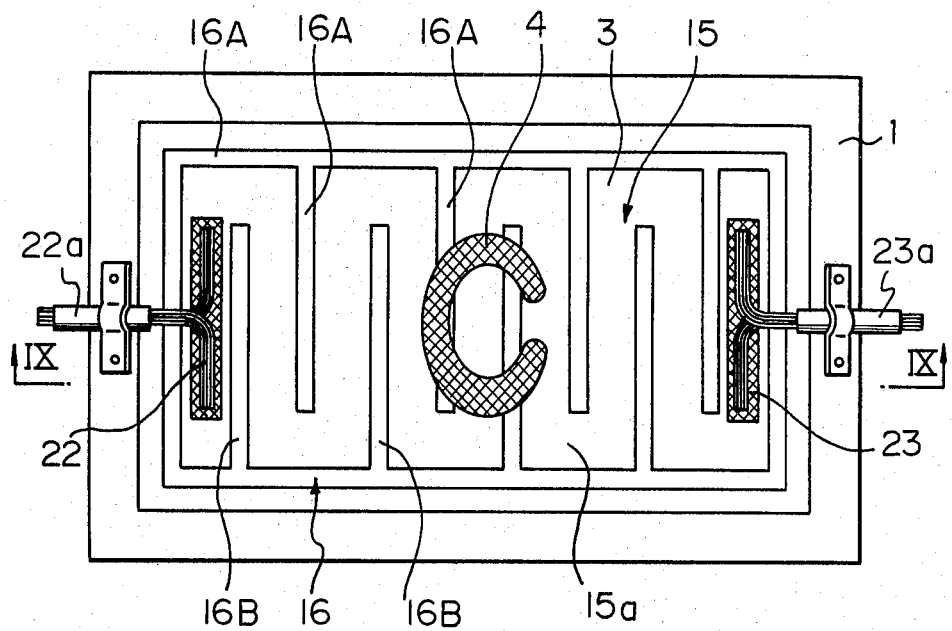
Figure 9:
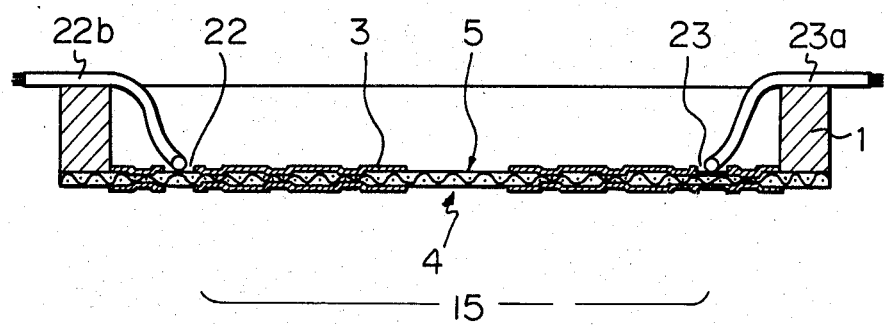
Figure 10:
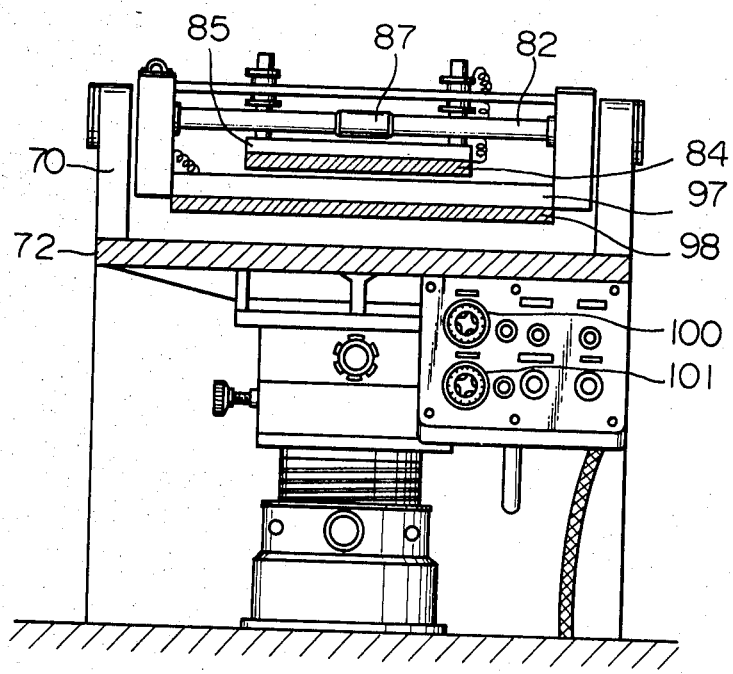
Figure 11:
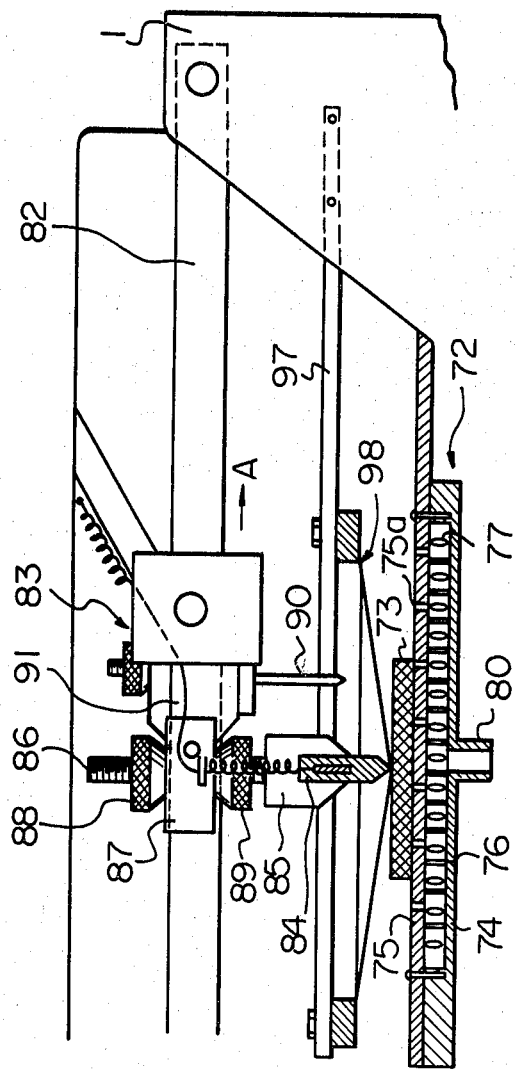
Figure 12:
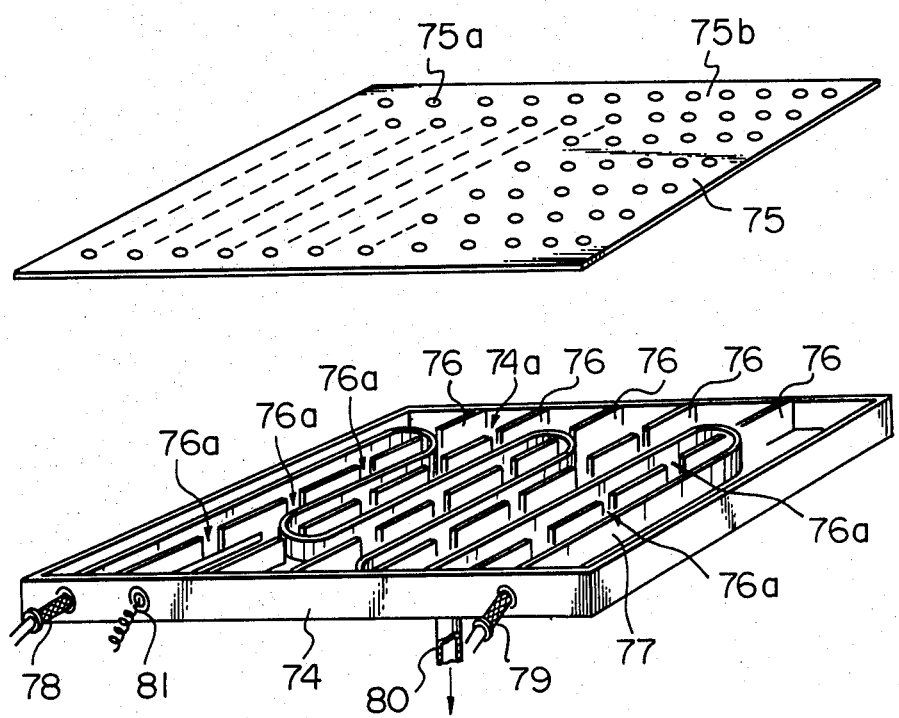
Figure 13A:
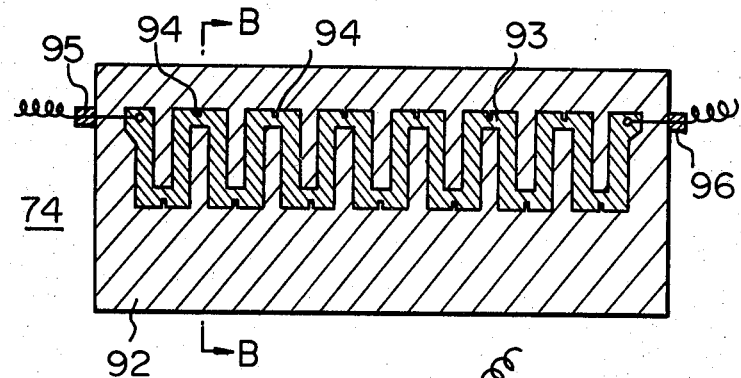
Figure 13B:
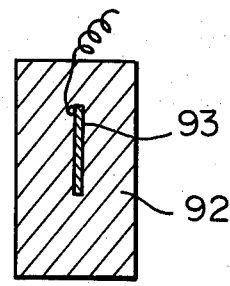
Figure 14:
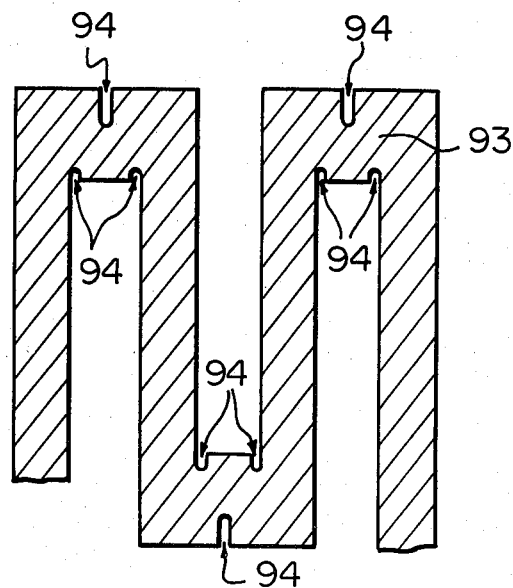

The present invention is explained hereinafter in detail with reference to FIGS. 3 through 14, wherein:

FIG. 3 is a plan view of a screen plate according to an embodiment of the present invention;

FIG. 4 is a cross sectional view along line IV—IV of FIG. 3;

FIG. 5 is a partially enlarged view of FIG. 4;

FIGS. 6A through M illustrate successive steps for producing the screen plate illustrated in FIGS. 3 through 5;

FIG. 7 is a graph illustrating a relationship between the phosphorous content of a nickel phosphorous alloy and the strain which is induced in the alloy until the destruction of the alloy, as well as the electric resistivity of the alloy;

FIG. 8 is a plan view of a screen plate according to another embodiment of the present invention;

FIG. 9 is a cross sectional view along line IX—IX of FIG. 8;

FIG. 10 is a front view of a hot melt screen priting machine according to an embodiment of the present invention;

FIG. 11 is a cross sectional view of an essential part of the printing machine illustrated in FIG. 10;

FIG. 12 is an elevational view of a disassembled printing base according to an embodiment of the present invention;

FIG. 13A is a front cross sectional view of a squeezing means according to an embodiment of the present invention;

FIG. 13B is a cross sectional view along line B—B of FIG. 13A, and;

FIG. 14 is an enlarged view of a resistor enclosed with in the squeezing means.

Illustrated in FIGS. 3 and 4 is a screen plate for hot melt screen printing according to an embodiment of the present invention. A screen mesh 15 is spread within and fixed to a frame 1. The frame 1 consists of a material, such as aluminum, having a high mechanical strength, and has a rectangular form. The screen mesh 5 is fixed to the frame 1 at the periphery thereof. A resin coating stencil 3 is applied on each surface of the screen mesh 15, except for the surfaces of the screen mesh where a printing pattern 4 and electrodes patterns 18, 19 are formed. However, the resin coating stencil 3 may be applied on only one of the surfaces of the screen mesh 15. The screen mesh 15 comprises fibers made of an insulating material, such as organic resin, for example, Tetoron and nylon. These fibers are woven in the form of a mesh or screen. An electroless plating layer (not shown in FIGS. 3 and 4) is formed on the fibers of the screen mesh 15, except for the region of the mesh indicated by the reference numeral 16. This region 16, which has a rectangular shape with a width $W_1$, surrounds the central region (first region) 15a of the mesh and acts as an electrical insulating region. The central region 15a of the screen mesh is resistance-heated as explained in detail hereinbelow, while the electric current is not conducted through an outer region (third region) 17 separeted from the central region 15a by the electrical insulating region (second region) 16. The electrical insulating region 16, therefore, electrically insulates the frame 1 from the central region 15a. In the central (first) region 15a, electrode patterns 18 and 19 are formed and expose the screen mesh comprising the fibers coated with the electroless plating layer. A current supplying terminal 22 or 23 is connected to the screen mesh 5 exposed within each of the electrode patterns 18 and 19.

Referring to FIG. 5, the electroless plating layers $M_1$ and $M_2$ are deposited around each of the longitudinal fibers 20a and the traversal fibers 20b, respectively, of the central region 15 and outer region 16 of the mesh. The thickness of the electroless plating layers $M_1$ and $M_2$ may be from 3 to 5 microns. The electroless plating layers $M_1$ and $M_2$ can be formed by a known electroless plating technique of nickel or other metals. No plating layer is formed on the fibers 20a and 20b of the second region 16 of the screen mesh, which is therefore electrically insulative. The electrical insulating region 16, wherein no electroless plating layer is formed, can be manufactured by, firstly, applying the electroless plating layer on all of the fibers of the mesh and, secondly, removing the electroless plating layer by a chemical etching from the second region.

Referring again to FIG. 3, the distance $d_1$ between the electrode patterns 18 and 19 is made smaller than the moving distance of a squeezing means (not shown). Lead wires 22a and 23a are connected, by soldering or the like, to the current-supplying terminals 22 and 23, respectively, at one end thereof, and the lead wires 22a and 23a are fixed to the frame 1 by fixing means 30 and 31, such as metal fittings, respectively. The lead wires 22a and 23a are connected to a power source (not shown). The central region 15a, including the screen mesh exposed through the printing pattern 4, is heated due to the electric current from the power source conducted through the electroless plating layers $M_1$ and $M_2$ having resistivity explained in detail hereinbelow. As a result of the structure of the screen mesh, the following advantages are achieved in the present invention.

1. The central region 15a of the screen mesh 15, where the resistance heating is realized, exhibits a high mechanical strength, because the adhesion force of the electroless plating layers $M_1$ and $M_2$ to the fibers 20a and 20b is high. Therefore, in this region 15a, a stress generation and peeling of the electroless plating layer are not liable to occur during the resistance heating and squeezing, and hence, the printing accuracy is high.

2. The current density at the central region 15a of the screen mesh with respect to the surface area of the screen mesh is uniform and, hence, the temperature distribution within the screen mesh is uniform during the heating. The ink or paste squeezed through the printing pattern 4 is, therefore, uniformly heated.

3. Since the electroless plating layers $M_1$ and $M_2$ are very thin, for example from 3 to 5 micron thick, the diameters of the fibers with these plating layers are increased only negligibly as compared with the fibers without these plating layers. Accordingly, the printing accuracy in the present invention is not reduced by the increase in the diameters mentioned above.

4. A high amount of heat generation is achieved by a low electrical current.

In the embodiment illustrated in FIGS. 3 through 5, the frame 1 is made of a metallic material. However, at least a part of the frame 1 may be made of an insulating material. The electrical insulating region 16 may be omitted when the electrical current cannot be conducted through the frame 1.

In one embodiment of the present invention, the electroless plating layers $M_1$ and $M_2$ (FIG. 5) consist of a nickel alloy containing phosphorus. In this embodiment, the resistivity of these layers is higher than that of the nickel plating layer. It is, therefore, possible to print a larger dimensioned article using a lower or the same current as compared to the printing using the screen plate with the nickel plating.

Referring to FIG. 7, the resistivity $L_1$ of the nickel phosphorous alloy is increased with the increase in the phosphorous content. The curve $L_2$ in FIG. 7 indicates a strain of the nickel phosphorous alloy induced due to the application of tensile force to the alloy, at which strain the alloy is ruptured or destroyed. This strain is hereinafter referred to as a rupture strain. The rupture strain $L_2$ is increased with the increase in the phosphorous content of up to approximately 9%. Therefore, the ductility of the nickel phosphorous alloy is reduced and this alloy becomes brittle with the increase of the phosphorous content. A preferably phosphorous content is from approximately 2.0 to approximately 3.0%. At this phosphorous content, the rupture strain is low and, hence the alloy is not brittle, while the resistivity of the alloy is in the range of from $17.25 \times 10^{-8}$ to $37.5 \times 10^{-8} \Omega$-m, as seen from FIG. 7, which resistivity is from 2.5 to 5 times the resistivity of pure nickel, i.e. $6.9 \times 10^{-8} \Omega$-m.

In FIGS. 8 and 9 another embodiment of the screen plate according to the present invention is illustrated. The same parts of the screen plate as those illustrated in FIGS. 3 and 4 are numbered with the same reference numerals in FIGS. 8 and 9. A feature of the screen plate illustrated in FIGS. 8 and 9 is a zigzag pattern of the first region 15a of the mesh, which is resistance-heated. This zigzag pattern of the resistance-heated region 15a is formed by, firstly, depositing an electroless plating layer on the fibers and, secondly, removing the electroless plating layer from the electrically insulating region 16, which is composed of two comb form regions 16A and 16B. In the screen plate with the zigzag resistance-heated (first) region 15a, the resistance of this region can be increased as compared with that of the screen plate illustrated in FIGS. 3 and 4. When the surface area of the printing pattern 4 is large, it is usually necessary to conduct a high current through the resistance-heated region 15a. However, since the resistance of the resistance-heated region is high in the embodiment illustrated in FIGS. 8 and 9, the current is relatively low as compared with that used in the screen plate illustrated in FIGS. 3 and 4. The electric power source for heating the resistance-heated region 15a is, therefore, advantageously small.

An embodiment of the process for producing the screen plate will now be explained with reference to FIGS. 6A through M.

Figure 6A:
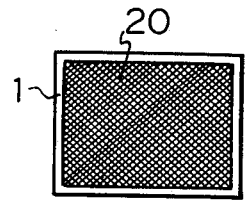
Figure 6B:
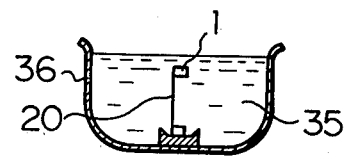
Figure 6C:
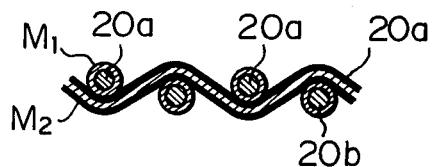
Figure 6D:
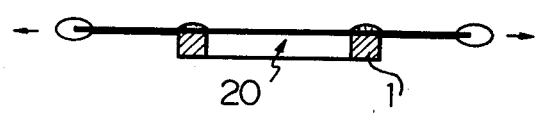

Referring to FIG. 6A, the fibers 20 made of an insulating material, such as Tetoron, are spread within a rectangular frame 1, so that a mesh or screen is formed by the fibers. The frame 1 with the mesh is then immersed into an electroless plating solution 35 of, for example, nickel, within a plating vessel 36 as illustrated in FIG. 6B, so as to non-electrolytically deposite nickel on the fibers. The electroless plating layers $M_1$ and $M_2$ (FIG. 6C) having a thickness of, for example, from 3 to 5 microns are formed around the fibers 20.

Figure 6E:
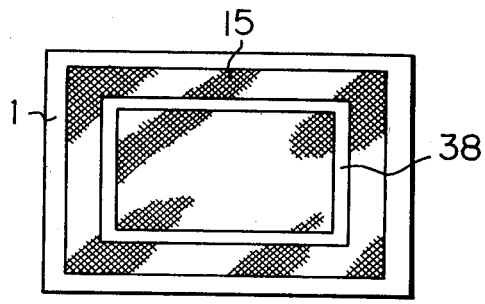
Figure 6F:
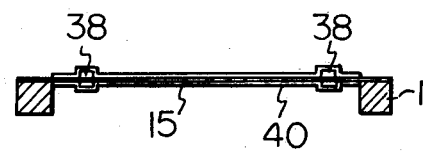
Figure 6G:
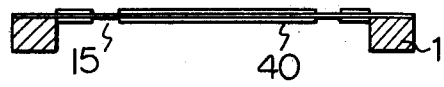
Figure 6H:
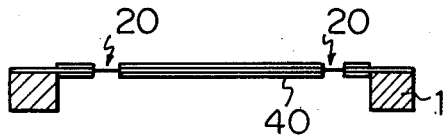

The fibers 20 (FIG. 6D), on which the electroless plating layers $M_1$ and $M_2$ are applied, is fixed to the frame 1 by means of a bonding agent or any other fixing means, while the fibers are subjected to a tensile force using a not shown spreading machine. Subsequently, as illustrated in FIG. 6E, a masking tape 38 is applied on both surfaces of the screen mesh 5 spread within the frame 1. The surface area of the screen mesh within the masking tape is greater than the printing pattern explained hereinbelow. An acid-resistant masking layer 40 is coated over the screen mesh 15 including the region covered by the masking tapes 38 as illustrated in FIG. 6F. The masking tapes 38 are then peeled off from the screen mesh 15, so that the fibers 20 with the nickel plating layer thereon are exposed at the regions of the screen mesh on which the masking tapes had been applied. The exposed nickel plating layer is removed by a chemical etching, so that the fibers 20 (FIG. 6H) are exposed. The region of the screen mesh 15, where the fibers are exposed, constitutes an electrical insulating region.

Figure 6I:
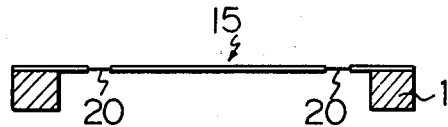
Figure 6J:
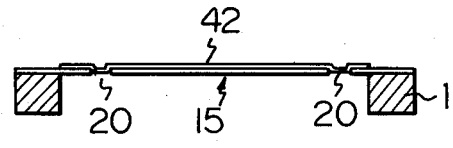
Figure 6K:
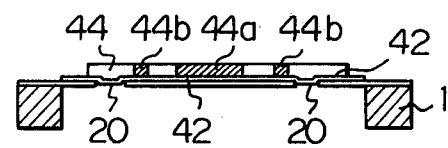

The acid-resistant masking layer 40 is removed as illustrated in FIG. 6I and, then a photosensitive emulsion layer 42 (FIG. 6J) is applied on one surface of the screen mesh 15 including the region where the fibers 20 are exposed. A positive type setting pattern 44 (FIG. 6K) is superimposed on the photosensitive emulsion layer 42.

In the process according to the present invention, the printing pattern 4 and the electrode patterns 18 and 19 can be formed by a photo engraving technique and, therefore, patterns with high accuracy can be easily formed.

Figure 6L:
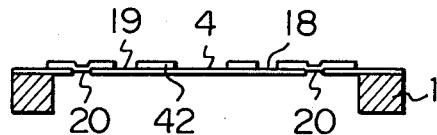
Figure 6M:
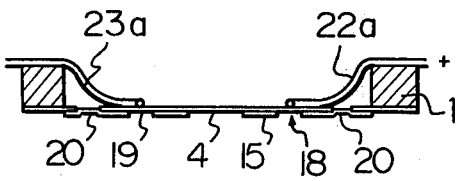

The positive type setting pattern 44 includes the printing pattern portion 44a and the electrode pattern portions 44b. The photosensitive emulsion layer 42 is exposed to light and, then, developed. The photosensitive emulsion layer 42 is, therefore, selectively removed, and the nickel plating layer of the screen mesh is exposed at the printing pattern 4 and the electrode patterns 18 and 19 (FIG. 6L). The type setting is at that point completed.

After the completion of the type setting, lead wires 22a and 23a (FIG. 6M) are bonded on the nickel plating layer exposed in the electrode patterns, and the production of the screen plate is completed.

Illustrated in FIGS. 10 through 14 is a hot melt screen printing machine according to another embodiment of the present invention.

Reference numeral 70 in FIG. 10 indicates the body of the hot melt screen printing machine. This body 70 is provided with a horizontal printing base 72. An article to be printed 73 (FIG. 11) is stationarily mounted on the printing base 72 by means of a vacuum suction or the like. The printing base 72 is, as illustrated in FIG. 11, comprised of a printing base body 74 having a recess and an upper plate 75 covering the upper surface of the printing base body 74. The upper plate 75 is provided with a number of apertures 75a. The inner space 74a of the printing base 72 is divided by partition walls 76 (FIGS. 11 and 12) into subspaces which are communicated with each other via notches 76a formed at portions of the partition walls 76. A flexible heat-generating resistor 77 passes through several notches 76a in the form of a zigzag pattern. Means 78 and 79 for supplying electric power to the resistors are connected to both ends of the heat-generating resistor 77. The inner space 74a is communicated with a vacuum pump (not shown) via a suction conduit 80. A temperature sensing means 81 protrudes into the inner space 74a and is connected to a temperature countrolling device (not shown). The electric power supplying means 78 and 79 and the temperature sensing means 81 are fitted on a side plate of the printing base body 74. The suction conduit 80 is fitted on the bottom plate of the printing base body 74. On the upper plate 75 the article to be printed 73 is supported and a number of apertures 75a pass through the upper plate in a direction perpendicular to the surface 75b of the upper plate.

The printing base body 74 and the upper plate 75 with apertures are preferably made of a heat resistant material and are preferably bonded to each other by a heat resistant bonding agent or a mechanical means, such as screws or rivets.

A squeezing shaft 82 (FIGS. 10 and 11) is provided with a printing unit 83 which is movable along the squeezing shaft 82. The printing unit 83 comprises a squeezing means 84, a holder 85 of the squeezing means 84, a screw 86 rigidly connected to the holder 85, a securing body 87 of the holder, through which body the screw 86 penetrates vertically and adjustably, and printing pressure-adjusting knobs 88, 89 which are fitted on the screw 86. The position of the squeezing means 84 can be displaced upwards or downwards, by loosening the printing pressure-adjusting knobs 88, 89, displacing the screw 86 upwards or downwards, and fastening the securing body 87 by the printing pressure-adjusting knobs 88, 89.

The printing unit 83 is provided with an ink doctor 90 for raking ink, and a holder 91 of the ink doctor 90 is secured to the securing body 87, so that the holder is vertically movable.

The ink doctor 90 is preferably made of a resin, such as acrylic, phenol or epoxy resin; or a nonmetallic material with a resin coating thereon, so as to achieve a small amount of heat radiation from the ink doctor.

FIGS. 13A and B are enlarged cross sectional views of the squeezing means 84. The body 92 of the squeezing means 84 is made of an elastic heat-resistant material, such as urethane rubber. A heat-generating resistor 93 is enclosed within the body 92 of the squeezing means. The heat-generating resistor 93 is produced by photo-etching a metallic foil, for example a nickel chromium foil, so as to shape the metallic foil in a zigzag pattern. The so shaped metallic foil is then enclosed within a urethane rubber which is molded around the metallic foil. It is preferable to form notches 94 (FIG. 14) on parts of the metallic foil, because a strain generation during the hardening and shrinkage of the urethane rubber can be mitigated by such notches. Both ends of the heat-generating resistor 93 is connected to an electric power source (not shown) via electrodes 95 and 96.

Referring to FIG. 10, a frame 97 is fixed to the body 70 of the printing machine at both ends thereof and is located above the printing base 72. A screen plate 98 of a hot melt screen printing is fixed to a frame 97 by means of screw means which are secured to the frame of the screen plate.

Printing is carried out by the hot melt screen printing machine illustrated in FIGS. 10 through 14 as explained hereinafter.

The printing unit 83 is moved in the direction indicated by the arrow A of FIG. 11 at a forward moving stage thereof, thereby moving the squeezing means 84 within the screen plate 98 in this direction. The printing ink is squeezed from the printing pattern to the article to be printed 73, while the screen plate 98 is resistance-heated. The printing ink is subjected to the heating effect by the resistance-heated region of the screen mesh of the screen plate 98 and is changed to a viscous paste. The printing ink is printed on the article to be printed, while the viscous paste is heated during the passage of the printing pattern. The current conducted through the resistance-heated region is adjusted by a dial 100 located on a console of the hot melt screen printing machine, while the current conducted through the heat-generating resistors of the squeezing means and the printing base is adjusted by a dial 101.

Prior to explaining the advantages involved in the hot melt screen printing machine illustrated in FIGS. 10 through 14, the problems involved in the hot melt screen printing machine without the heat-generating resistors 77 and 93 are explained. Cold articles to be printed are repeatedly mounted on the printing base and are removed from the printing base after the hot melt screen printing. The heat of the screen plate, which is provided with the screen mesh according to the present invention, is withdrawn by the articles to be printed, and the temperature of the screen plate is decreased due to the heat withdrawal. As a result of the temperature decrease, a problem of poor separation of the screen plate from the printed article arises. In addition, when the hot melt screen printing is repeated a number of times, the printing ink adheres to the squeezing means and the adhering ink ascends along the outer surface of the squeezing means in the direction toward the holder of the squeezing means. The part of the squeezing means in contact with the screen plate is warmed by a radiation heat from the screen plate. The temperature of the squeezing means is decreased with the increase in the distance from the screen plate and, therefore, the ink adhered on the upper part of the squeezing means is solidified and piled up, and may drop on the screen plate during the printing. The screen plate may be destroyed and printing may become impossible by the dropped solidified ink, which is another problem.

In accordance with the hot melt screen printing machine illustrated in FIGS. 10 through 14, it is possible to prevent a poor separation of the screen plate 98 from the article to be printed 73 due to the solidification of the printing ink, because the article to be printed 73 is adhered by suction to the printing base 72 and is subjected to the heating effect of the heat-generating resistor 77 situated within the printing base 72. In addition, since the heat-generating resistor 93 is enclosed within the squeezing means 84, the squeezing means 84 and the holder 85 of the squeezing means are heated to such a temperature that the printing ink adhering to the squeezing means 84 and the holder 85, during every printing cycle is not solidified but is maintained in a viscous paste state. Therefore, it is possible to prevent the solidification and piling up of the printing ink on the squeezing means 84 and the holder 85, and the destruction of the screen plate 98 due to dropping of the solid ink on the screen plate. Furthermore, since the squeezing means 84 is heated, the heat radiation from the screen plate 98 is negligible and the screen plate 98 is kept at an almost constant temperature. The temperature condition of the hot melt screen printing is, therefore, improved over the hot melt screen printing machine illustrated in FIGS. 3 and 4, because of the heating of the squeezing means 84.

In addition to the advantages achieved by the heating of the printing base 73 and the squeezing means 84, an advantage is achieved by the material of the ink doctor 90 selected according to the present invention. The ink doctor 90 descends to the level of the screen plate 98 and is then moved in the direction opposite to the arrow A of FIG. 11, at a backward moving stage of the printing unit 83, during which stage the printing ink is pushed by the ink doctor 90 to the original position on the screen plate 98. Since the material constituting the ink doctor 90, such as an acrylic, phenol or epoxy resin, is heat insulating, the heat radiation from the ink doctor is so small at every backward moving stage, that the solidification of the ink on the ink doctor can be prevented.

The hot melt screen printing machine according to the present invention is particularly suitable for the mass production of electronic parts required to have a high precision.

I claim:

1. A hot melt screen printing having a screen plate, said screen plate comprising:
   a metalic frame
   a screen mesh fixed to sais frame, said screen mesh formed from a plurality of insulating material fibers and an electroless, conductive plating layer formed on each of the fibers in first and third regions of said screen mesh, said first and third regions being separated and electrically insulated from each other by a second region, the insulating material fibers of said second region not having a conductive plating layer formed thereon, a resin coating applied onto said mesh on predetermined portions thereof, the portions of said mesh not included in said predetermined portions forming a printing pattern and electrode patterns; and
   power supply means for supplying an electric current to said screen mesh, said power supply means having electrodes coupled to said screen mesh at said electrode patterns thereon.

2. A hot melt printing machine as set forth in claim 1 wherein said printing pattern and said electrode patterns are positioned in said first region of said screen mesh.

3. A hot melt printing machine according to claim 1, wherein said insulating material fibers are polyester synthetic fibers.

4. A hot melt screen printing machine according to claim 1, wherein said first region is in the form of a zigzag pattern as seen in a plan view.

5. A hot melt screen printing machine according to claim 4, wherein said second region comprises two comb form regions as seen in a plan view, and said two comb form regions are arranged in a zigzag pattern as seen in a plan view.

6. A hot melt screen printing machine according to claims 3, 4, 5 or 1, wherein said electroless plating layer is a nickel plating layer.

7. A hot melt screen printing machine according to claims 3, 4, 5 or 1, wherein said electroless plating layer is a nickel alloy plating layer containing phosphorous.

8. A hot melt screen printing machine according to claim 7, wherein the phosphorous content of said nickel alloy is from approximately 2.0 to approximately 3.0%.

9. A hot melt screen printing machine according to claim 1, wherein said machine further comprises a printing base for mounting an article to be printed and a squeezing means for passing a printing ink from said screen pattern toward said article to be printed, and at least one of said printing means and said squeezing means is provided with a heating means.

10. A hot melt screen printing machine according to claim 9, wherein said heating means is a heat-generating resistor.

11. A hot melt screen printing machine according to claim 10, wherein said heating means of said squeezing means is enclosed within the body of said squeezing means comprising an elastic heat-resistant resin.

12. A hot melt screen printing machine according to claim 11, wherein said heating means of said squeezing means is provided with notches.

13. A hot melt screen printing machine according to claim 9, wherein said heating means of said printing base is situated within the body of said printing base having a recess.

* * * * *

UNITED STATES PATENT AND TRADEMARK OFFICE
CERTIFICATE OF CORRECTION

PATENT NO. : 4,398,462

DATED : August 16, 1983

INVENTOR(S) : TADAO OKANO

It is certified that error appears in the above-identified patent and that said Letters Patent is hereby corrected as shown below:

Column 9, Claim 1, line 39, after "printing" insert --- machine ---.

Column 9, Claim 1, line 42, change "sais" to --- said ---.

Signed and Sealed this

Fifth Day of September, 1989

Attest:

DONALD J. QUIGG

*Attesting Officer*

*Commissioner of Patents and Trademarks*